United States Patent [19]

Ellingson et al.

[11] Patent Number: 5,175,879
[45] Date of Patent: Dec. 29, 1992

[54] LINEAR AMPLIFIER WITH FEEDBACK PATH AND PHASE ERROR COMPENSATION

[75] Inventors: David B. Ellingson, Bedford, Tex.; Walter J. Rozanski, Jr., Hurst, both of Tex.

[73] Assignee: Motorola, Inc., Schaumburg, Ill.

[21] Appl. No.: 691,246

[22] Filed: Apr. 25, 1991

[51] Int. Cl.[5] .......................... H04B 1/04; H03F 1/32
[52] U.S. Cl. .................................... 455/126; 455/127; 455/341; 330/109; 330/149
[58] Field of Search ............. 455/123, 126, 127, 38.3, 455/116, 341; 330/107, 109, 129, 149

[56] References Cited
U.S. PATENT DOCUMENTS 4,591,800  5/1986  Opas .................................. 330/149
4,933,986  6/1990  Leitch ................................ 455/126
5,021,753  6/1991  Chapman ........................... 455/126
5,066,922  11/1991 Leitch ................................ 455/126
5,066,923  11/1991 Gailus et al. ...................... 330/107
5,121,077  6/1992  McGann ............................ 455/126

OTHER PUBLICATIONS

Fourth International Conference on "HF Radio Systems and Techniques" IEE Conference Publication No. 284.

Primary Examiner—Reinhard J. Eisenzopf
Assistant Examiner—Lisa Charouel
Attorney, Agent, or Firm—Robert S. Babayi

[57] ABSTRACT

A linear amplifier comprising a feedback loop is stabilized by determining phase error between an error signal and a feedback signal and shifting the phase of a forward signal accordingly.

16 Claims, 2 Drawing Sheets

LINEAR AMPLIFIER WITH FEEDBACK PATH AND PHASE ERROR COMPENSATION

TECHNICAL FIELD

This invention relates generally to the field of amplifiers and in particular to linear amplifiers.

BACKGROUND

A radio frequency (RF) linear amplifier, such as a radio transmitter power amplifier, is an amplifier that increases the power of a modulated carrier signal while preserving both the amplitude and phase modulation components of the signal. Whereas, a saturating RF amplifier, commonly used in frequency-modulation (FM) radio transmitters, preserves phase modulation of the signal, but may remove or severely distort any amplitude modulation (AM) component. FM signals typically have constant amplitude, and thus, do not require linear amplification. However, more sophisticated communication systems, such as those receiving and transmitting digital data, may require both amplitude and phase modulation (PM) of the transmitted signals. Linear amplifiers are therefore necessary to transmit those signals.

Negative feedback principal is commonly used to provide substantially linear amplifiers. One such linear RF amplifier generally comprises a feedback loop circuit having an amplifier in the forward path which provides an amplified RF out signal. Typically, the RF output signal is demodulated to provide a feedback signal at baseband. The feedback signal is applied to a summer in the forward signal path to close the loop circuit.

In practice, RF circuits are typically located at some distance from the baseband circuitry. The separation of the RF circuits and the baseband circuits introduces a time delay which appears as additional phase shift in the feedback signal causing the overall phase margin of the loop circuit to be reduced. The reduction of phase margin may cause oscillation at certain transmit frequencies.

One approach in compensating the phase shift is to measure a phase error within the feedback loop. A known method for measuring the phase shift requires an initial setup procedure. A disadvantage of this approach, however, is that the feedback loop must be broken, i.e. opened, to measure the phase error of the loop. Additionally, the phase error correction circuitry must be preset to provide optimum results. Therefore, there is a need to provide a simplified approach for compensating the phase shifts caused by the path time delays in the linear amplifier circuit.

SUMMARY OF THE INVENTION

Briefly, according to the invention, a linear amplifier for amplifying an input signal comprises a loop circuit which includes a forward signal path and a feedback signal path. The forward signal path includes a summer and an amplifier to produce an output signal. The output signal is fed back on the feedback signal path to produce a feedback signal. The summer compares the feedback signal with the input signal to produce an error signal. A phase detector is continuously coupled to the feedback signal and the error signal to provide a phase error signal by determining the phase difference between the error signal and the feedback signal. A phase shifter varies the phase of the signal in the forward signal path in response to the phase error signal.

DETAILED DESCRIPTION OF THE PREFERRED EMBODIMENT

Figure 1:
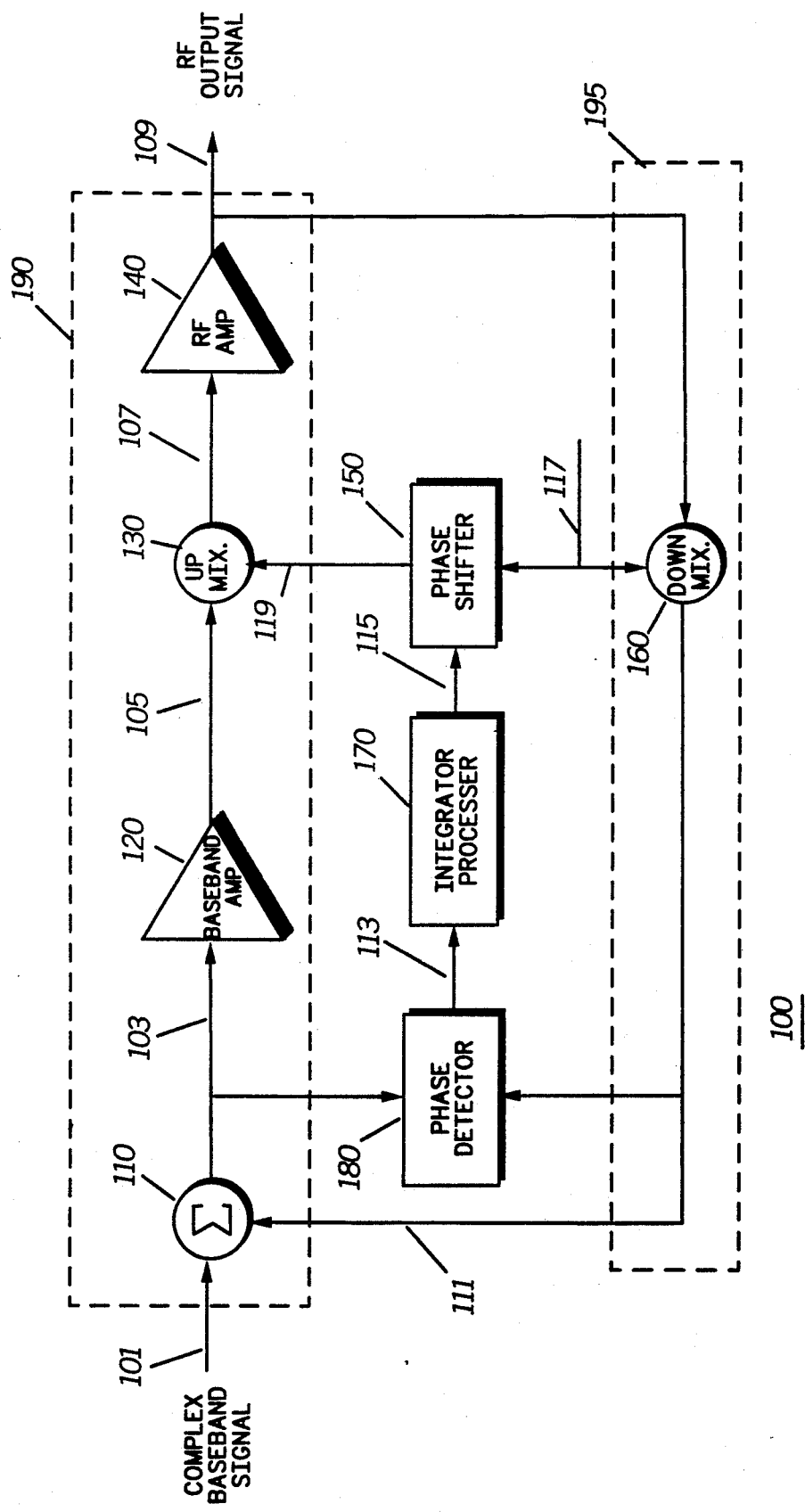
FIG. 1 is a block diagram of a linear amplifier circuit according to the present invention.

Referring to FIG. 1, an linear amplifier 100, according to the present invention, comprises a loop circuit having a forward signal path (shown in the dotted block 190) and a feedback signal path (shown in the dotted block 195) to provide an amplified RF output signal which is substantially stable and free of distortion. In the preferred embodiment of the invention, the linear amplifier 100 is utilized for amplifying complex baseband signals for a radio transmitter.

The linear amplifier 100 receives an input signal 101 which comprises a complex baseband signal having quadrature components, i.e., I and Q components. The input signal 101 is applied to a summer 110 which also receives a feedback signal 111 to provide an error signal 103. The error signal is amplified by a baseband amplifier 120 to provide an amplified baseband signal 105. An up mixer 130 receives a carrier signal 117 from an oscillator source and through a phase shifter 150 up mixes the amplified baseband signal 130 to provide a forward signal 107. The forward signal 107 is amplified by a radio frequency amplifier 140 to provide an RF output signal 109. In this arrangement, complex baseband signal 101, the error signals 103, the amplified baseband signals 105 and the forward signal 107 comprise signals on the forward signal path of the linear amplifier 100.

The RF output signal 109 is fed back and applied to a down mixer 160. The down mixer 160 receives the radio frequency signal 109 and the carrier signal 117 to provide the feedback signal 111 at baseband. The feedback signal 111 is applied to the summer 110 to close the linear amplifier 100's loop circuit. Therefore, the feedback signal 111 and the RF output signal 109 also comprise signals on the feedback signal path.

According to the present invention, a phase detector 180 is continuously coupled to the error signal 103 and the feedback signal 111 to provide a phase error signal 111. The phase detector 180 determines the phase difference between the error signal 103 and the feedback signal 111 to produce the phase error signal 113. The phase error signal is applied to an integrator 170 which integrates the phase error signal 113 over time and provides an integrated phase error signal 115 to the phase shifter 150. In the preferred embodiment of the present invention, the integrator 170 comprises a well-known microprocessor. The phase shifter 170, in response to the integrated phase error signal 115, varies the phase of the carrier signal 117 which, in turn, provides phase variation for the forward signal 107 to compensate the phase error of the loop circuit. It may be appreciated that the other signals in the forward signal path, such as the complex input signal 109 may be input to the phase detector 180 to produce the phase error signal 113. Also, the phase shifter may be used to vary the phase of a signal along the feedback signal path, Accordingly, the phase difference between a signal in the forward signal path and a signal in the feedback path may be used to compensate phase error within linear amplifier loop ciruit. It may be appreciated that because the error signal 103 and the feedback signal are continuously coupled to the phase detector 180 the need for breaking up the linear amplifier's loop circuit and the setup procedures of the prior art is eliminated.

Figure 2:
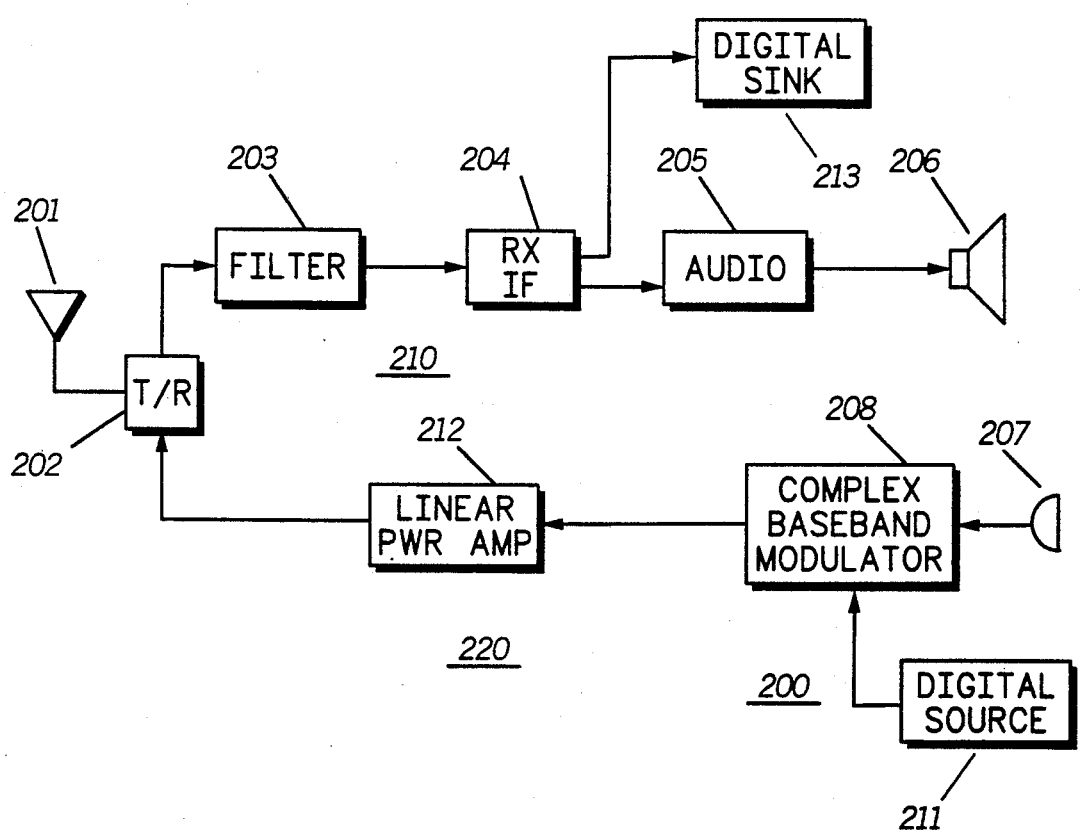
FIG. 2 is a block diagram of a radio utilizing the linear amplifier of the present invention.

Referring to FIG. 2, a block diagram of an exemplary two-way communication radio 200 which utilizes a linear amplifier according to principals of the present invention is shown. The radio 200 includes a receiver section 210 and a transmitter section 220 which allow it to operate in receive and transmit modes. The receiver section 210 and the transmitter section 220 comprise means for communicating, i.e., transmitting or receiving, communication signals for the radio 200.

In the receive mode, the portable radio 200 receives a communication signal via an antenna 201. A transmit/receive (T/R) switch 202 couples the received communication signal to a filter 203 which provides the desired selectivity for the received communication signal. The output of the filter 203 is applied to a well-known receiver IF section 204 which recovers the baseband signal. The output of the receiver IF section is applied to a well-known audio section 205 or digital sink 213 which, among other things, amplifies audio messages and presents them to a speaker 206.

In the transmit mode, audio messages are input via a microphone 207 or digital source 211, the output of which is applied to a well-known complex baseband modulator 208 to provide a modulating signal for a linear power amplifier 212. The linear power amplifier 212 utilizes the principals of the present invention to amplify the output of the complex baseband signal modulator 208. The output of the linear power amplifier 212 is applied to the antenna 201 through the T/R switch 202 for transmission.

What is claimed is:

1. A linear amplifier circuit having a forward signal path and a feedback signal path, comprising:
   a summer for providing an error signal by comparing an input signal and a feedback signal;
   an amplifier for amplifying a forward signal produced by said error signal and for providing an output signal; said output signal being fed back on the feedback signal path to produce said feedback signal;
   a phase detector being continuously coupled to said error signal and said feedback signal for providing a phase error signal; and
   a phase shifter for varying the phase of the forward signal on the forward signal path in response to said phase error signal.

2. The linear amplifier circuit of claim 1, further including:
   an up mixer for mixing up said error signal to produce said forward signal; and
   a down mixer for mixing down said output signal to produce said feedback signal.

3. The linear amplifier circuit of claim 2, wherein said error signal and said output signal are respectively mixed up and mixed down by a carrier signal.

4. The linear amplifier circuit of claim 3, wherein said phase shifter varies the phase of said carrier signal.

5. The linear amplifier circuit of claim 2, wherein said error signal is amplified by a baseband amplifier before being applied to said up mixer.

6. The linear amplifier circuit of claim 1, wherein said input signal comprises a complex signal.

7. The linear amplifier circuit of claim 1, further including an integrator for integrating the phase error signal for applying an integrated phase error signal to said phase shifter.

8. The linear amplifier circuit of claim 7, wherein said integrator comprises a microprocessor.

9. In a radio including means for transmitting communicating communication signals, a linear amplifier comprising:
   a summer for providing an error signal by comparing said input signal and a feedback signal;
   an amplifier for amplifying a forward signal produced by said error signal and for providing an output signal; said output signal being fed back to produce said feedback signal;
   a phase detector being continuously coupled to said error signal and said feedback signal for providing a phase error signal; and
   a phase shifter for varying the phase of said forward signal in response to said phase error signal.

10. The linear amplifier circuit of claim 9, further including:
    an up mixer for mixing up said error signal to produce said forward signal; and
    a down mixer for mixing down said output signal to produce said feedback signal.

11. The linear amplifier circuit of claim 10; wherein said error signal and said output signal are respectively mixed up and mixed down by a carrier signal.

12. The linear amplifier circuit of claim 11, wherein said phase shifter varies the phase of said carrier signal.

13. The linear amplifier circuit of claim 10, wherein said error signal is amplified by a baseband amplifier before being applied to said up mixer.

14. The linear amplifier circuit of claim 9, wherein said input signal comprises a complex signal.

15. The linear amplifier circuit of claim 9, further including an integrator for integrating the phase error signal for applying an integrated phase error signal to said phase shifter.

16. The linear amplifier circuit of claim 15, wherein said integrator comprises a microprocessor.

* * * * *